US009899501B2

(12) United States Patent
Pourtois et al.

(10) Patent No.: US 9,899,501 B2
(45) Date of Patent: Feb. 20, 2018

(54) TWO-DIMENSIONAL MATERIAL SEMICONDUCTOR DEVICE

(71) Applicants: IMEC VZW, Leuven (BE); Katholieke Universiteit Leuven, KU LEUVEN R&D, Leuven (BE)

(72) Inventors: Geoffrey Pourtois, Villers-la-Ville (BE); Anh Khoa Lu, Luik (BE); Cedric Huyghebaert, Heverlee (BE)

(73) Assignees: IMEC VZW, Leuven (BE); Katholieke Universiteit Leuven, KU LEUVEN R&D, Leuven (BE)

( * ) Notice: Subject to any disclaimer, the term of this patent is extended or adjusted under 35 U.S.C. 154(b) by 0 days.

(21) Appl. No.: 15/380,887

(22) Filed: Dec. 15, 2016

(65) Prior Publication Data

US 2017/0179263 A1     Jun. 22, 2017

(30) Foreign Application Priority Data

Dec. 22, 2015 (EP) .................................. 15201834

(51) Int. Cl.
*H03K 3/01* (2006.01)
*H01L 29/66* (2006.01)
*H01L 29/786* (2006.01)

(52) U.S. Cl.
CPC .. *H01L 29/66977* (2013.01); *H01L 29/78645* (2013.01); *H01L 29/78681* (2013.01); *H01L 29/78684* (2013.01); *H01L 29/78696* (2013.01)

(58) Field of Classification Search
CPC .................................................. H01L 29/66977
See application file for complete search history.

(56) References Cited

U.S. PATENT DOCUMENTS

2014/0361341 A1* 12/2014 Sriram .............. H01L 29/42356
                                                            257/194

* cited by examiner

*Primary Examiner* — Daniel Puentes
(74) *Attorney, Agent, or Firm* — Knobbe Martens Olson & Bear, LLP

(57) ABSTRACT

A semiconductor device comprises a two-dimensional (2D) material layer, the 2D material layer comprising a channel region in between a source region and a drain region; a first gate stack and a second gate stack in contact with the 2D material layer, the first and second gate stack being spaced apart over a distance; the first gate stack located on the channel region of the 2D material layer and in between the source region and the second gate stack, the first gate stack arranged to control the injection of carriers from the source region to the channel region and the second gate stack located on the channel region of the 2D material layer; the second gate stack arranged to control the conduction of the channel region.

13 Claims, 13 Drawing Sheets

TWO-DIMENSIONAL MATERIAL SEMICONDUCTOR DEVICE

CROSS-REFERENCE TO RELATED APPLICATION

Any and all priority claims identified in the Application Data Sheet, or any correction thereto, are hereby incorporated by reference under 37 CFR 1.57. This application claims the benefit of European Application No. EP 15201834.7, filed on Dec. 22, 2015. The aforementioned application is incorporated by reference herein in its entirety, and is hereby expressly made a part of this specification.

FIELD OF THE DISCLOSURE

The disclosure relates to semiconductor devices more specifically to semiconductor devices comprising two-dimensional material. The disclosure further relates to methods of producing such two-dimensional based semiconductor devices.

BACKGROUND OF THE DISCLOSURE

As is well known, the number of transistors on integrated circuits approximately doubles every two years, in accordance with Moore's Law. However, the continuation of the classical metal-oxide-semiconductor field-effect-transistor (MOSFET) scaling beyond the 12 nm technology node will only be possible if device engineers replace the traditional silicon channel of e.g. a transistor by more powerful semiconductor materials. High carrier mobility materials such as germanium and/or compound semiconductor materials have now matured to an industrial development level, but even these materials reach their limits in view of very small devices. One of the fundamental limitations of MOSFETs is its subthreshold slope or more often used in its inverse term as subthreshold swing (SS), which describes the exponential behavior of the current in function of the voltage applied. The subthreshold swing is limited to 60 mV/decade (at room temperature being 300K) irrespective of the materials and geometries used. However for low power applications a faster switching is desired between off-state (off current) and on-state (on-current). Therefore SS should be decreased below 60 mV/dec.

An alternative device concept explored nowadays which has a decreased SS below 60 mV/decade is the tunneling field-effect-transistor (TFET). A TFET device comprises a p-i-n structure and its working mechanism is based on gate-controlled band-to-band tunneling. p-type TFET devices are however difficult to manufacture. TFET devices make use of doped source and drain regions wherein the quality of the interface between the different doping regions (being chemically doped or by using a heterostructure) may influence the tunneling mechanism. Especially in group IV and group III-V based TFET devices the interface quality becomes important as interface defects may induce trap-assisted tunneling or interband tunneling in the off state (device is turned off) and as a consequence will influence the Ion/Ioff properties of the TFET device.

Another possible device concept which has sub-60 mV/decade SS is an energy-filtered FET. U.S. Pat. No. 8,129,763 B2 discloses an energy-filtered FET comprising a channel in between a source and drain, a gate proximate the channel configured to control the conduction of the channel and between the source and channel an energy filter to control the injection of carriers. The energy filter includes a superlattice structure. The superlattice structure is realized as a multilayer periodic structure of alternating semiconductor layers with wide and narrow band gaps thereby forming so called mini-bands. Superlattice structures may be formed using epitaxial techniques or sputtering. The formation and integration of a superlattice in a FET is however not easy. Moreover as a periodic structure of layers of two or more materials is formed, the interface defects between the different layers also need to be controlled. III-V materials tend to intermix such that it is difficult to build a sharp interface between the different materials of the superlattice. Also the number of periods needed is high, as such making the device hard to scale to smaller dimensions.

There is a need for new device concepts with sub-60 mV/decade SS which may be easily manufactured.

SUMMARY OF THE DISCLOSURE

It is an object of particular embodiments to provide a semiconductor device with SS below 60 mV/decade.

It is another object of embodiments to provide a method for manufacturing such a semiconductor device.

It is another object of embodiments to provide a method of operating such a semiconductor device.

The above objectives are accomplished by a device and method according to certain embodiments.

Particular and preferred aspects of the invention are set out in the accompanying independent and dependent claims. Features from the dependent claims may be combined with features of the independent claims and with features of other independent claims as appropriate and not merely as explicitly set out in the claims.

It is an object of embodiments of the present disclosure to provide a semiconductor device having a sub-60 mV/decade SS which may be easily manufactured.

In a first aspect, the present disclosure provides a semiconductor device comprising a two-dimensional (2D) material layer having a longitudinal direction, the 2D material layer comprising a channel region, a source region at one side in the longitudinal direction of the 2D material layer and a drain region at the other side in the longitudinal direction of the 2D material layer; a first gate stack and a second gate stack in contact with the 2D material layer, the first and second gate stack being spaced apart over a distance D; each gate stack comprising a gate dielectric layer and a gate electrode, the gate dielectric layer being sandwiched between the gate electrode and the 2D material layer; the first gate stack located on the channel region of the 2D material layer and in between the source region and the second gate stack, the first gate stack arranged to control the injection of carriers from the source region to the channel region; the second gate stack located on the channel region of the 2D material layer; the second gate stack arranged to control the conduction of the channel region.

According to embodiments arranged to control the injection of carriers is for forming discrete energy levels and a region of depleted density of states either in the conduction band or in the valence band of the 2D material layer underneath the first gate stack upon applying a voltage V111 to the first gate stack at a source-to-drain voltage $V_{DS}$ and a voltage V112 to the second gate stack.

According to embodiments the device may be turned from OFF to ON state upon applying a predetermined voltage V111 and a variable voltage V112.

According to embodiments the semiconductor device is a n-type device and V111 is chosen between 0 and 1.5V and V112 is varied from a negative value to 0V and wherein the device is OFF at the negative value and is turned ON at 0V.

According to embodiments the gate length of the first and/or the second gate stack is chosen in a range between 2 nm and 30 nm.

According to embodiments the distance D between the first gate stack and the second gate stack is chosen in a range between 2 nm and 30 nm.

According to embodiments the 2D material layer comprises a group IV 2D material or a group III-V 2D material such as or a group V 2D material or a TMCD.

According to embodiments the semiconductor device may further comprise a control circuitry connected to the first gate and the second gate. The control circuitry is arranged to apply a respective voltage to the first gate and/or the second gate.

In a second aspect a method for operating a semiconductor device according to the first aspect is disclosed, the method comprising: applying a predetermined gate voltage V111 to the first gate stack for inducing discrete energy levels and a depleted density of states in the conduction band or in the valence band in the 2D material layer underneath the first gate stack 111; modulating the gate voltage V112 of the second gate stack for turning the device from OFF to ON; applying a predetermined source-to-drain voltage $V_{DS}$.

According to embodiments V111 is chosen between 0V and 1.5V.

According to embodiments V111 is least 1V.

According to embodiments V112 is varied from a value between −1V to 0V for turning the device from OFF to ON respectively.

It is an advantage of embodiments that the semiconductor device has a subthreshold swing lower than 60 mV/decade (at room temperature being 300K). More specifically a SS lower than 30 mV/decade may be achieved. The semiconductor device according embodiments has a steep I-V curve and thus less power will be consumed when the transistor is switched from an on-state to an off-state.

It is an advantage of embodiments that the semiconductor device is compatible with standard CMOS integration.

It is an advantage of embodiments that the semiconductor device is junctionless.

It is an advantage of embodiments that the semiconductor device may be p-type or n-type.

Particular and preferred aspects of the disclosure are set out in the accompanying independent and dependent claims. Features from the dependent claims may be combined with features of the independent claims and with features of other dependent claims as appropriate and not merely as explicitly set out in the claims.

These and other aspects of the disclosure will be apparent from and elucidated with reference to the embodiment(s) described hereinafter.

BRIEF DESCRIPTION OF THE DRAWINGS

The invention will now be described further, by way of example, with reference to the accompanying drawings. All figures are intended to illustrate some aspects and particular embodiments of the present invention. The figures are depicted in a simplified way for reason of clarity. Not all alternatives and options are shown and therefore the invention is not limited to the content of the given drawings. Like numerals are employed to reference like parts in the different figures.

All drawings are intended to illustrate some aspects and embodiments of the present disclosure. The drawings described are only schematic and are non-limiting.

DETAILED DESCRIPTION OF ILLUSTRATIVE EMBODIMENTS

Figure 1:
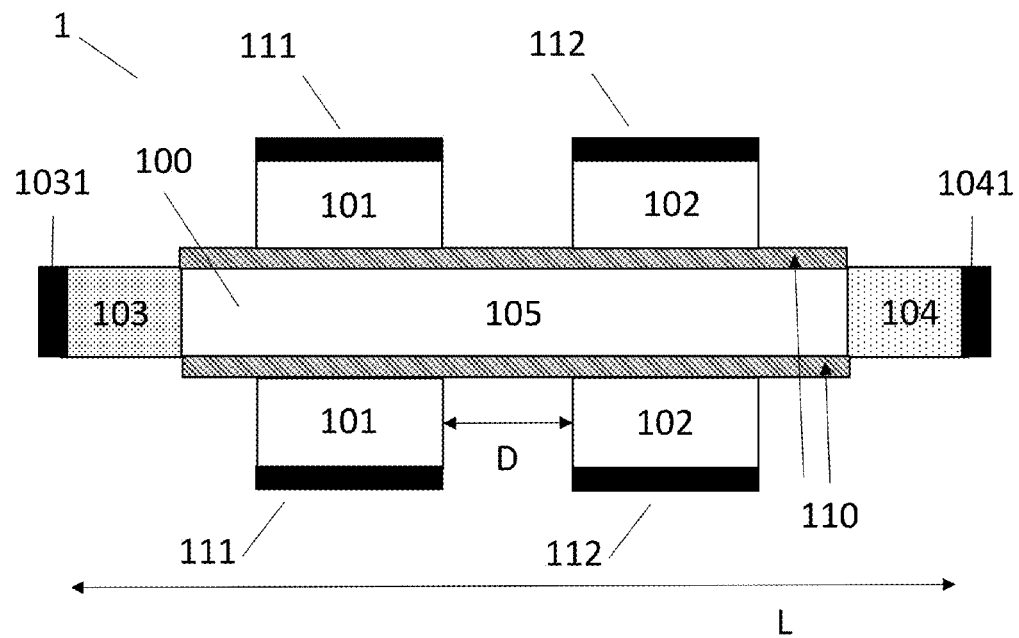
FIGS. 1-2 shows a schematic representation of a semiconductor device according to different embodiments of the present disclosure.
Figure 2:
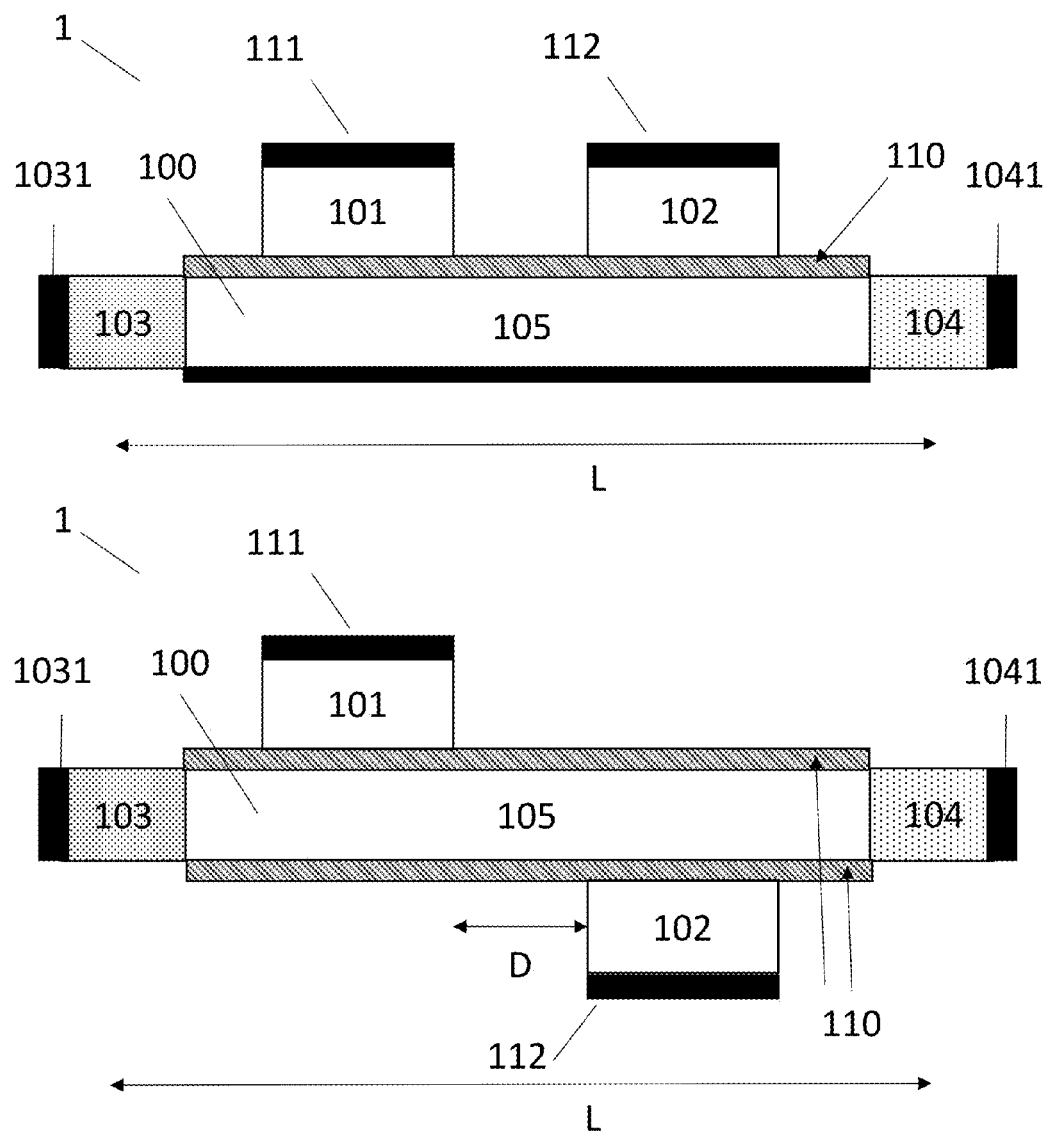

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the invention.

Moreover, the term top and the like in the description and the claims are used for descriptive purposes and not necessarily for describing relative positions. It is to be understood that the terms so used are interchangeable under appropriate circumstances and that the particular embodiments described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the disclosure, the only relevant components of the device are A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

All numbers expressing length, amplitude, size, and so forth used in the specification are to be understood as being modified in all instances by the term 'about.' Accordingly, unless indicated to the contrary, the numerical parameters set forth herein are approximations that may vary depending upon the desired properties sought to be obtained. At the very least, and not as an attempt to limit the application of the doctrine of equivalents to the scope of any claims in any application claiming priority to the present application, each numerical parameter should be construed in light of the number of significant digits and ordinary rounding approaches.

Where a range of values is provided, it is understood that the upper and lower limit, and each intervening value between the upper and lower limit of the range is encompassed within the embodiments.

All references cited herein are incorporated herein by reference in their entirety. To the extent publications and patents or patent applications incorporated by reference contradict the disclosure contained in the specification, the specification is intended to supersede and/or take precedence over any such contradictory material.

Unless otherwise defined, all terms (including technical and scientific terms) are to be given their ordinary and customary meaning to a person of ordinary skill in the art, and are not to be limited to a special or customized meaning unless expressly so defined herein. It should be noted that the use of particular terminology when describing certain features or aspects of the disclosure should not be taken to imply that the terminology is being re-defined herein to be restricted to include any specific characteristics of the features or aspects of the disclosure with which that terminology is associated. Terms and phrases used in this application, and variations thereof, especially in the appended claims, unless otherwise expressly stated, should be construed as open ended as opposed to limiting.

Similarly it should be appreciated that in the description of exemplary particular embodiments, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

In the description provided herein, numerous specific details are set forth. However, it is understood that particular embodiments may be practiced without these specific details. In other instances, well-known methods, structures and techniques have not been shown in detail in order not to obscure an understanding of this description.

The invention will now be described by a detailed description of several particular embodiments. It is clear that other particular embodiments can be configured according to the knowledge of persons skilled in the art without departing from the technical teaching of the invention as defined by the appended claims.

An embodiment is illustrated in FIG. 1. A semiconductor device 1 is shown comprising a two-dimensional (2D) material layer 100 having a longitudinal direction (L). The semiconductor device may also be referred to as a metal-oxide-semiconductor field effect transistor (MOSFET).

The semiconductor device 1 according to certain embodiments is a junctionless device, which means the device has a uniform doping of the same type in the source region, channel region and drain region, more specifically the 2D material layer 100 has a uniform doping. In standard MOSFET devices highly doped source and drain regions are formed thereby creating source/channel and channel/drain junctions. However these (electrical) junctions are difficult to fabricate and can form a source for current leakage. By eliminating these junctions cheaper and denser devices may be fabricated.

According to embodiments the 2D material layer 100 may be doped. 2D materials are often naturally doped due to the presence of impurities and/or vacancies. Due to the material growth process of the 2D material layer, these are more or less abundant and lead to a natural n-type or p-type behavior. 2D materials may also be intentionally doped. 2D materials are typically doped using molecular doping. I.e. a molecule is spin-coated on top of the 2D material. Depending on its electronic configuration (position of the electronic level), an electron/hole transfer can either occur from the valence/conduction band of the 2D material to the electronic levels of the molecule. Another source of doping is the net dipole of the molecule which induces a local electric field and leads to a modification of the electron density (i.e. to a doping) of the system. So the range of molecules is pretty large (for instance polyvinyl alcohol, oleylamine . . . ). Alternatively 2D materials may be chemically doped for example by implantation or during the growth of the 2D material. Examples of dopants are either Fe, Cr or P, As, Cl, Br.

According to embodiments the 2D material layer 100 is preferably uniformly doped over its longitudinal direction L. The doping concentration of the 2D material layer 100 is preferably doped in the range of $10^{10}$ to $10^{14}$ |e|/cm$^2$.

The 2D material layer 100 may comprise a 2D material chosen from a wide range of possibilities which will be explained below.

Where in embodiments of the present disclosure reference is made to a two-dimensional (2D) material layer, reference is made to a semiconductor layer comprising a 2D material. Such materials have interesting properties in terms of mobility and parasitics and therefore allow for future scaling of transistor performance. A 2D material is formed as a regular network in two dimensions and therefore often referred to as a single layer material or monolayer-type material (wherein monolayer should be understood as 'up to a few monolayers'). One example of a 2D material is transition metal dichalcogenides (or TMCD), denoted by $MX_2$ with M a transition metal and X a chalcogenide. Examples of $MX_2$ material are for example $WS_2$, $MoS_2$, $WSe_2$, $MoSe_2$, $WTe_2$, $MoTe_2$. TMDCs have found interest as 2D materials due to the fact that they have a natural finite band gap, in contrast to graphene. Their unique structure moreover results in a highly inert, trap-free basal surface of the single crystals. Such TMDC materials, especially for instance $MoS_2$, are known already for a long time as lubricants, and have properties very similar to graphite. In their bulk state, they are composed of a layered material with strong in-plane bonding and weak out-of-plane interactions (the layers are only weakly bonded by van der Waals forces), such that individual layers can easily move with respect to each other and in this way reduce friction between moving parts.

According to embodiments the 2D material layer may comprise a group IV 2D material such as for example silicene, germanene and stanene or a group III-V 2D material such as for example GaAs, AlP, InN or a group V 2D material such as phosphorene and van der Waals materials wherein the cation is chosen from any of Mo, Hf, Cd, Ti, Zn, Ga, Zr and the anion is chosen from any of Se, Te, S, O (also referred to as TMCDs such as for example $WS_2$, $MoS_2$, $WSe_2$, $MoSe_2$, $WTe_2$, $MoTe_2$).

The semiconductor device 1 according to certain embodiments further comprises a source region 103 at one side in the longitudinal direction of the 2D material layer 100 and a drain region 104 at the other side in the longitudinal direction of the 2D material layer 100. Both the source and drain region 103, 104 comprise part of the 2D material layer 100 at each side respectively in its longitudinal direction and a source metal contact 1031 and drain metal contact 1041 to it respectively.

The semiconductor device 1 further comprises in between the source region 103 and the drain region 104 a channel region 100 which enables the flow of carriers from source region 102 to drain region 104. The source region 103 and the drain region 104 are thus located at opposite sides of the channel region 100.

Summarized the 2D material layer 100 comprises three device regions: a source region 103, a channel region 105 and a drain region 104.

The semiconductor device 1 further comprises a first gate stack 111 and a second gate stack 112 in contact with the 2D material layer 100, the first 111 and second gate stack 112 being spaced apart over a distance D. Each gate stack 111, 112 comprises a gate dielectric layer 110 and a gate electrode 101, 102, the gate dielectric layer 110 being sandwiched between the gate electrode 101, 102 and the 2D material layer 100 respectively. The first gate stack 111 is located on the channel region 105 and in physical contact with the 2D material layer 100 in between the source region 103 and the channel region 105. The first gate stack 111 is for controlling the injection of carriers from the source region 103 to the channel region 105. The first gate stack 111 is for creating localized energy states and a region of depleted density of states in the conduction band or valence band of the 2D material upon applying of a predetermined voltage to the first gate stack 111. The second gate stack 112 is located on the channel region of the 2D material layer 101. The second gate stack 112 serves as the normal control gate for controlling conduction of the channel region 105.

According to embodiments both first 111 and second gate stack 112 have a common gate dielectric layer 110. From integration point of view a shared gate dielectric layer simplifies the process flow for manufacturing the semiconductor device 1 according to certain embodiments as only one dielectric layer needs to be provided.

According to alternative embodiments the first gate stack 111 may comprise a first gate dielectric layer and the second gate stack 112 may comprise a second gate dielectric layer which is different from the first gate dielectric layer. Different gate dielectric layers for the first and second gate stack have the advantage of further confinement of the depleted density of states potential, which enables further control/tuning of the device operation.

According to embodiments the gate electrode 101, 102 of the first and/or second gate stack 111, 112 may comprise a material selected from at least one of poly silicon, poly germanium, metals such as Al, W, Ta, Ti, Ru, Pd, Rh, Re, Pt, and alloys thereof, metal-nitrides such as TaN and TiN, metal-silicon nitrides such as TaSiN, conductive oxides such as $RuO_2$ and $ReO_3$, fully silicided metals (FUSI) such as $CoSi_2$, NiSi and $TiSi_2$, fully germanided metals (FUGE), workfunction tunable metals, engineered materials to obtain a particular gate work function. In particular embodiments the gate electrode is made of a metal of which the work function has been engineered specifically for the chosen channel material in the channel region, the gate dielectric material, gate dielectric thickness and channel doping.

The gate dielectric layer extends along at least part of the 2D material layer and the gate electrode layer extends along the gate dielectric layer along a face of the gate dielectric layer opposing the face of the gate dielectric layer facing the 2D material layer. The gate electrode layer does not extend beyond the gate dielectric layer. The gate dielectric is at least situated below the whole length of the gate electrode but can extend longer, such as covering up to the whole length of the 2D material.

According to embodiments the gate dielectric layer 110 (being a common gate dielectric or separate gate dielectric layers) of the first and/or second gate stack 111, 112 may comprise a material selected from at least one of silicon based oxides (e.g., silicon dioxide, silicon oxy nitride), aluminum oxide, high-k oxides (oxides, nitrided oxides, silicates and nitrided silicates of transition metals such as Hf, Ta, Ti, Nb, V, Y, Zr). In particular embodiments the gate dielectric is a high-k oxide such as hafnium oxide. The thickness of the gate dielectric, e.g., gate oxide, is preferably in the range of 0.5 nm to 20 nm.

According to certain embodiments the amplitude of the voltage applied to the first gate stack and/or second gate stack 111, 112 can be tuned by the nature of the gate electrode materials used (preferably metal gate electrodes). Ideally the work function of the metal gate electrode should be equal to the value of the electronic affinity (n-type) or the work function (p-type) of the 2D material with a range of +− the mid-value of the band gap. For example for a n-type semiconductor device according to certain embodiments the first gate electrode may comprise TiCN and the second gate electrode may comprise TiN. For example for a p-type semiconductor device according to certain embodiments the first gate electrode may comprise Pt or Pd and the second gate electrode may comprise TaC, Co or Ni. Alternatively the work function of the first gate stack 111 and the second gate stack 112 may be equal (for example both gate electrodes comprising TiN). It is an advantage of having the same work function for both gate stacks 111, 112 of the device 1 that it may reduce the operating voltage.

According to embodiments the gate stacks 111, 112 may be present at both sides of the 2D material layer 100 or may be present all around the 2D material layer (so-called gate all around). Preferably the gate stacks (the first 111 and second 112 gate stacks) are located at the same side of the 2D material layer 100, but according to embodiments one gate stack may be at one side and the other gate stack may be at the other side of the 2D material layer 100.

A semiconductor device 1 according to embodiments comprising double gates at both sides of the 2D material layer 100 will lead to better electrostatic control and hence to a better subthreshold swing (up to 20 mV/dec).

Figure 3:
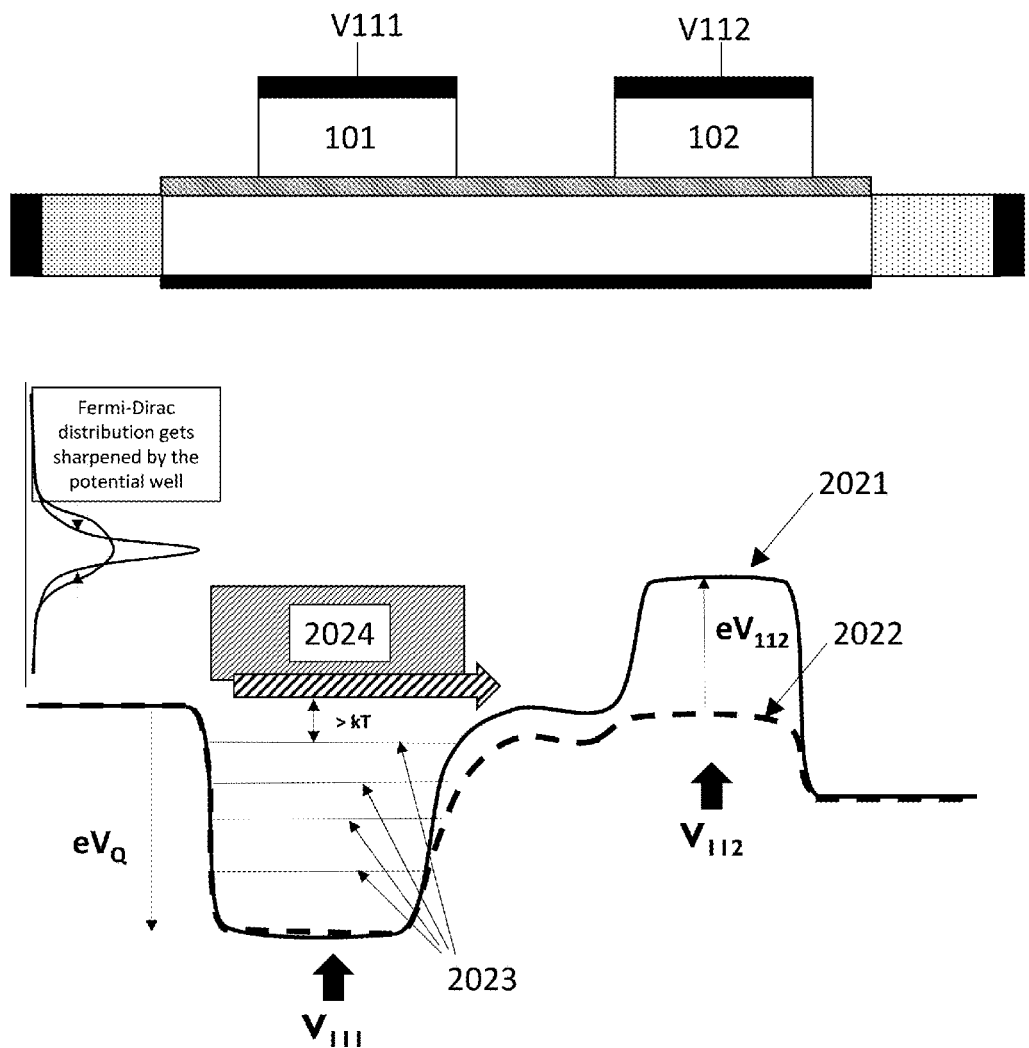
FIG. 3 shows a schematic representation of the working principle of a semiconductor device according to embodiments of the present disclosure.
Figure 4A:
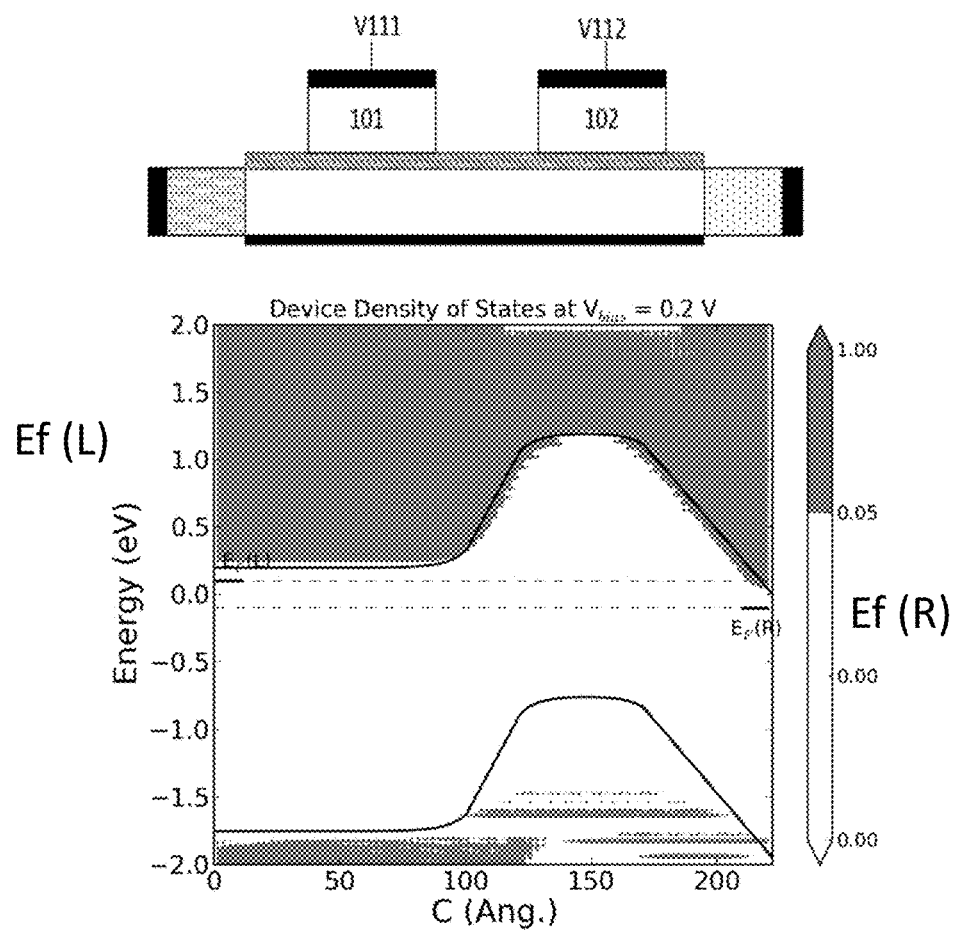
FIGS. 4A-D show simulation results of the energy levels in the semiconductor device according to embodiments of the present disclosure for a variation of voltages applied to the first gate stack and/or the second gate stack.
Figure 4B:
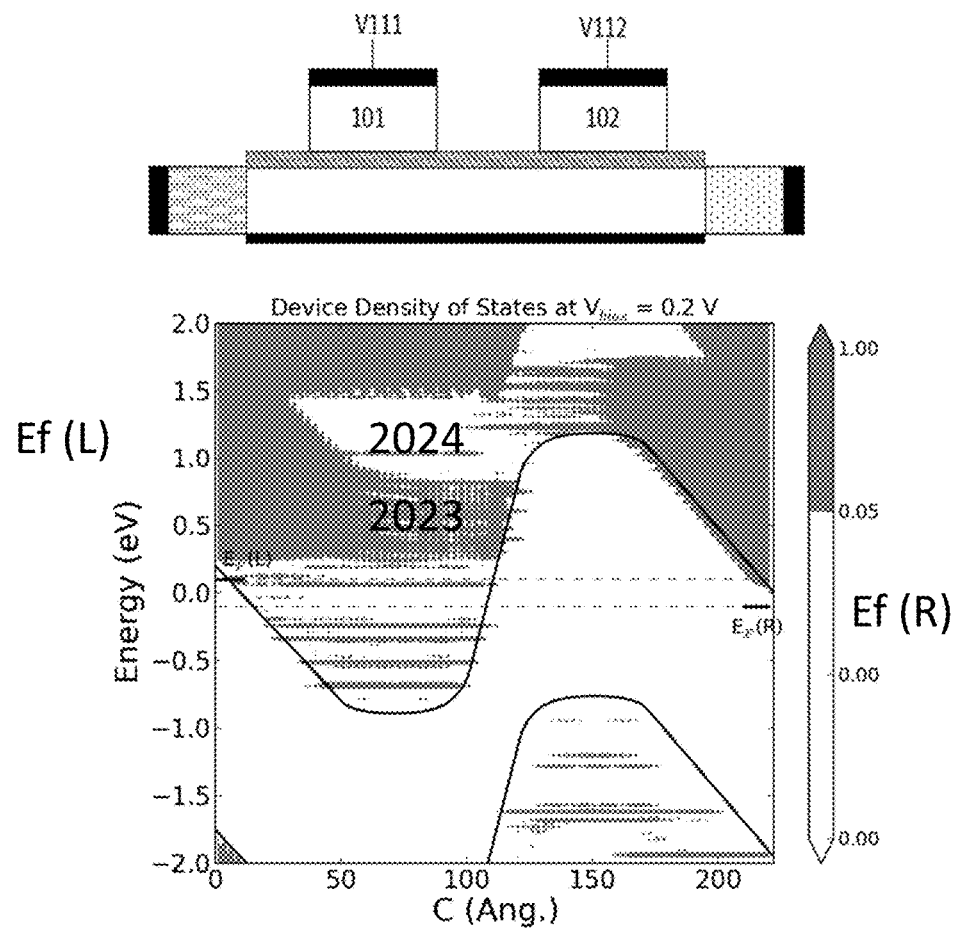
Figure 4C:
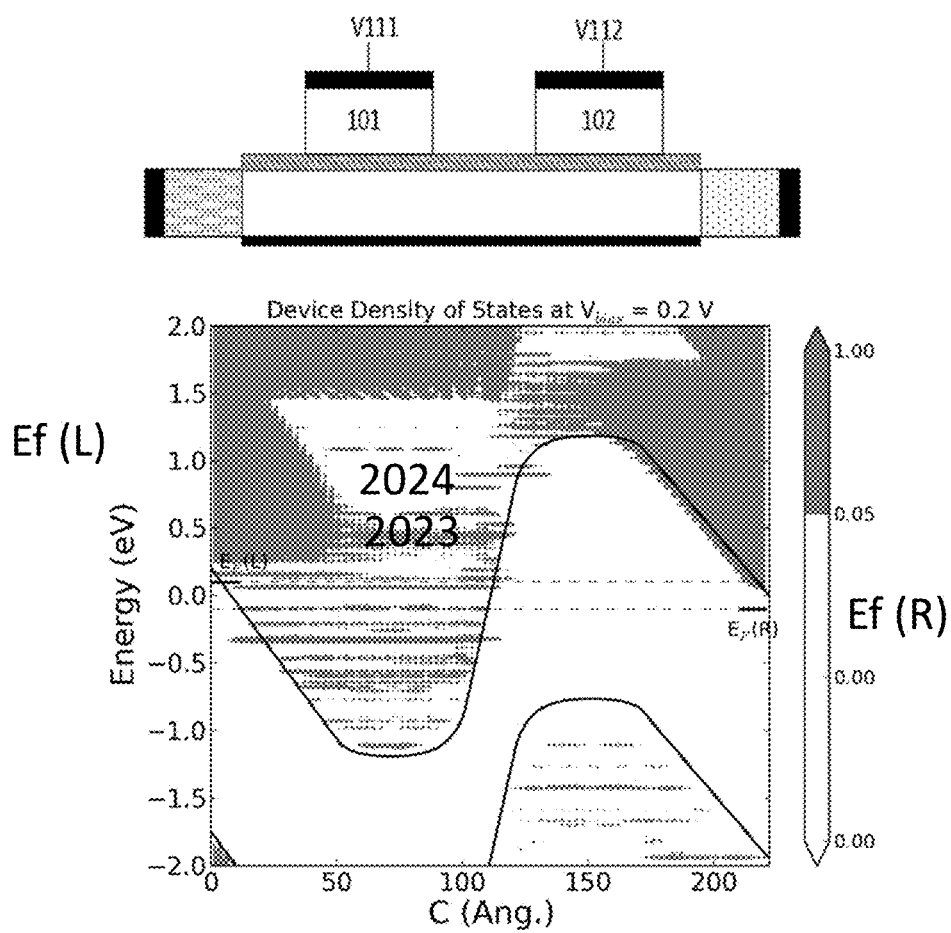
Figure 4D:
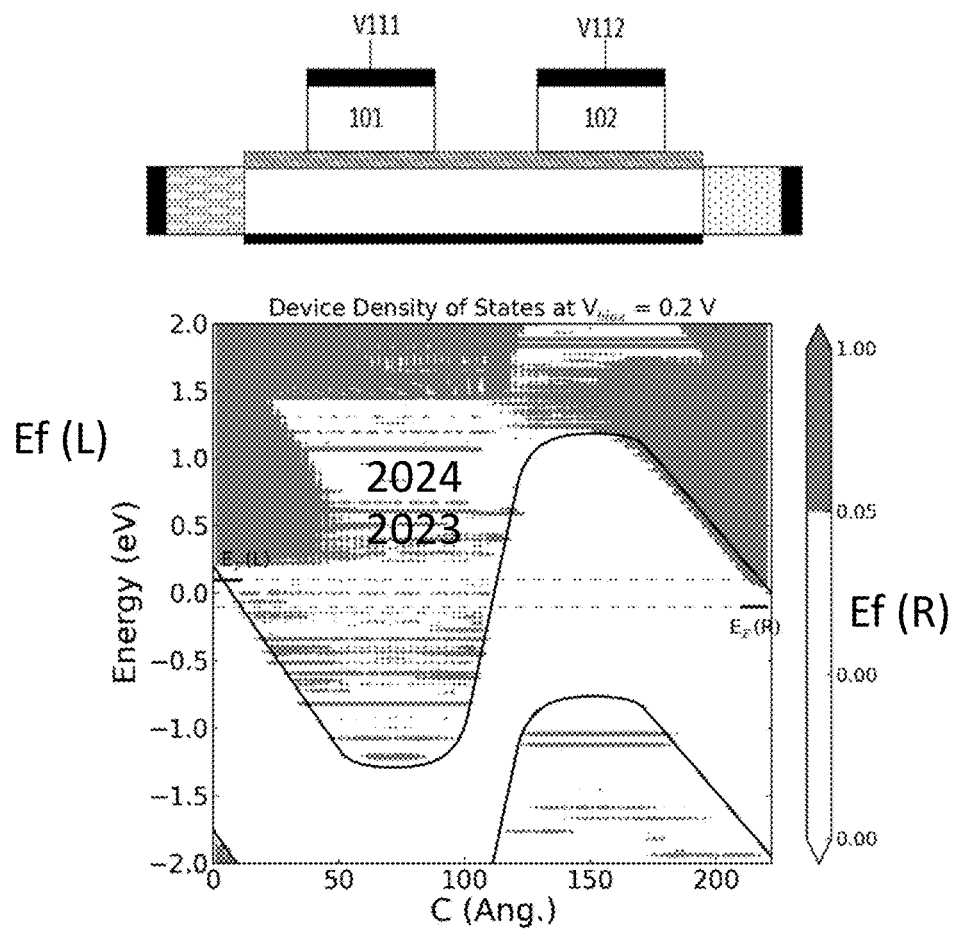

The working mechanism of the semiconductor device 1 according to certain embodiments will now further be explained using FIG. 3 with respect to a n-type 2D material based semiconductor device, thus the 2D material layer comprising a n-type 2D material. A person skilled in the art may easily adapt the following towards a p-type 2D material based semiconductor device: for example where there is referred to a conduction band in the description, this would have to be replaced by the valence band for a p-type semiconductor device; where there is referred to electrons, this would have to be replaced by holes for a p-type semiconductor device.

FIG. 3 shows the electrostatic potential profile (bottom) along the semiconductor device 1 (schematically shown on top) in the OFF state (full line, 2021) and in the ON state (dashed line, 2022) of the device. The electrostatic potential follows the same contour as the bottom energy level of the conduction band of the 2D material layer. In the OFF state, i.e. no voltage V111 is applied to the first gate stack 111, no current can flow, otherwise said, no electrons can form a path from the source region 103 via the channel region 105 to the drain region 104 (full line 2021). When applying the appropriate voltage V111 to the first gate stack 111, it is seen that the electrostatic potential changes shape. In the region of the 2D material layer underneath the first gate stack 111 energy splitting of the electronic levels 2023 occurs and a region of depleted density of states 2024 is formed. Simultaneously also the energy level of the conduction band underneath the second gate stack 112 will lower such that electrons can flow (dashed arrow) from the source region 103 to the drain region 105 via the depletion region 2024 and the channel region 105.

Certain embodiments involve thus the possibility to induce a strong localization of the electron quantum states by making use of the size quantization effect upon applying the appropriate voltage to the first gate stack 111. This effect breaks the delocalization of the wave function and induces localization of the conduction band. This leads to energy splitting of the electronic levels (2023) in the region of the 2D material layer below the first gate stack 112. Furthermore a region of depleted density of states (2024) is also formed in the conduction band. The first gate 112 may therefore be referred to as a quantization gate or filtering gate and the region of the 2D material layer below the first gate 112 may be referred to as a quantization region or filtering region. The region below the first gate stack 111 is approximately defined by the potential applied by the first gate stack 111 and the second gate stack 112 and by the gate length of the first gate stack. As a result, the electrons which are normally distributed in the continuum of the conduction band are forced to occupy a narrower and discrete distribution of the electronic levels in the conduction band due to the depleted density of states. When a transmission channel is created with the second gate stack (i.e. some electronic levels are resonating), the distribution of the energy of the electrons is filtered since there is no room to populate another electronic state. This level is then used for the electron/holes to travel from the source to the (channel) region underneath the second gate stack 112. The voltages applied to the second gate stack 112 are similar to the voltages which would be applied to a normal prior-art semiconductor device for modulating the conduction in the channel region. The second gate stack 112 acts thus as a normal gate as known for a person skilled in the art.

The characteristics of the first gate stack 111 (gate electrode material, gate dielectric material, work function, voltage applied) may be tuned in order to achieve a desired trade-off between on current $I_{on}$ and off current $I_{off}$ and thus to achieve a desired (steep) subthreshold swing (lower than 60 mv/dec, more preferably lower than 30 mV/dec) in the semiconductor device 1.

Figures 5A, 5B:
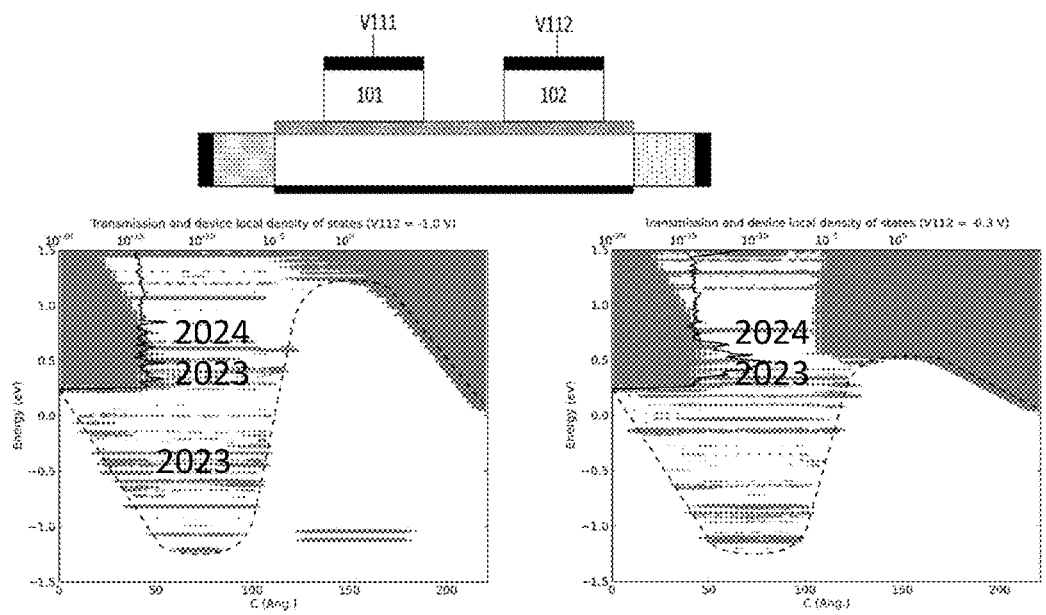
FIGS. 5A-D show simulation results of the energy levels in the semiconductor device according to embodiments of the present disclosure for a variation of voltages applied to the first gate stack and/or the second gate stack.
Figures 5C, 5D:
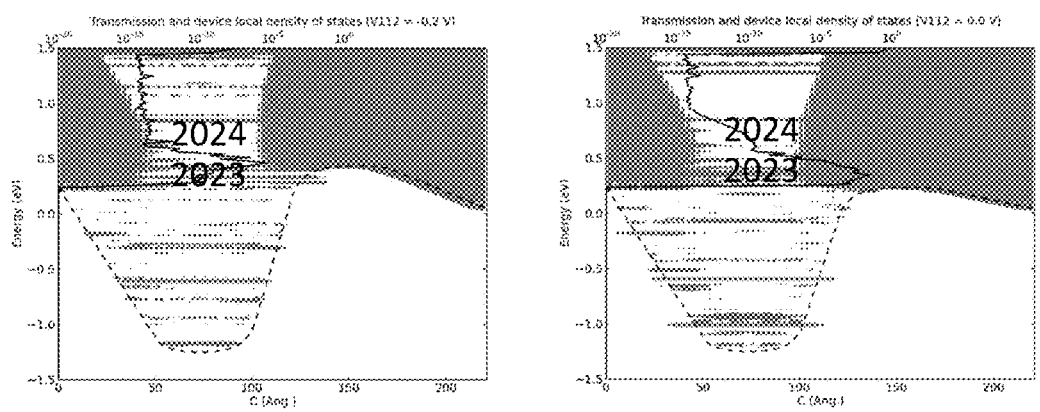

The device concept relies on the fact that when a positive (i.e. with respect to the voltage applied to the source contact and with respect to the work function of the gate stack) gate voltage at the first gate stack 111 is induced a quantum/depletion well is created and thus creating the possibility of forming bound states in the conduction band and as a result forces the localization of the wave function, leading to a splitting of the electronic energy levels and to energy filtering of the electron injected. The changes of the electrostatic potential along the length of the 2D material layer, the evolution of the energy states and the density of states are illustrated with simulation results as shown in FIGS. 4A-D. The energy levels are thus shown in function of the position in the device. The device is schematically shown on top to show the different regions (i.e. source 103 and drain 105 region, channel region 105 under the first gate stack 111 and channel region 105 under the second gate stack 112). The distribution of the localized density of states along the position of the channel region 105 in the 2D material (in between the source region and the drain region) is shown upon applying an appropriate voltage to the first gate stack 111 and a varying voltage to the second gate stack 112. A voltage of −1.0V is applied to the second gate stack (V112, VC), whereas the voltage applied to the first gate stack (V111, VQ) is varied from FIG. 4A (V111=0 V) to FIG. 4B (V111=1.1 V) to FIG. 4C (V111=1.4 V) to FIG. 4D (V111=1.5 V). The source-to-drain voltage (VDS) is 0.2 V. FIGS. 4A-D depict the local density of states in the device wherein light regions/lines being areas with no energy states and dark regions/lines being areas with high density of energy states. In the quantum well underneath the first gate stack different discrete states are observed (black lines). Thus below the first gate stack 111 to which a voltage V111 is applied, the density of states is strongly localized (separated black lines) while in the conduction band they are delocalized (gray/black continuum). It can be seen that by evolving from FIGS. 4A to 4D (corresponding to V111 being 0V for FIG. 4A, 1.1V for FIG. 4B, 1.4V for FIG. 4C, 1.5V for FIG. 4D—the voltage applied to the second gate stack is 0.2V) that a localization of the energy states 2023 and a region of depleted density of states 2024 is formed. By adapting the voltage V112 applied to the second gate stack 112, a current path or transmission path is induced between the source and drain region below the depleted density of states 2024. The transmission spectrum of the device for each energy level is shown (for V111=1.4 V) from FIG. 5A (V112=−1V) to FIG. 5B (V112=−0.3 V) to FIG. 5C (V112=−0.2 V) to FIG. 5D (V112=0 V). Evolving from FIG. 5A to FIG. 5D leads to a sharp increase in the transmission spectrum at the lowest conduction band levels, which corresponds to a rapid transition between the OFF (FIG. 5A) and ON (FIG. 5D) states.

The difference in energy between the position of the Fermi level (labeled as Ef, more specifically Ef(L) being the fermi level at the source side and Ef(R) being the fermi level at the drain side) and the second gate potential (V112, VG), controls the operation of the device.

Figure 6A:
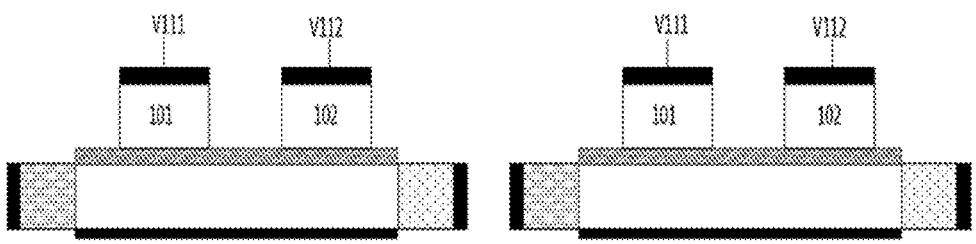
FIGS. 6A-B shows schematically the difference between OFF (FIG. 6A) and ON (FIG. 6B) state of a semiconductor device according to embodiments of the present disclosure.
Figure 6B:
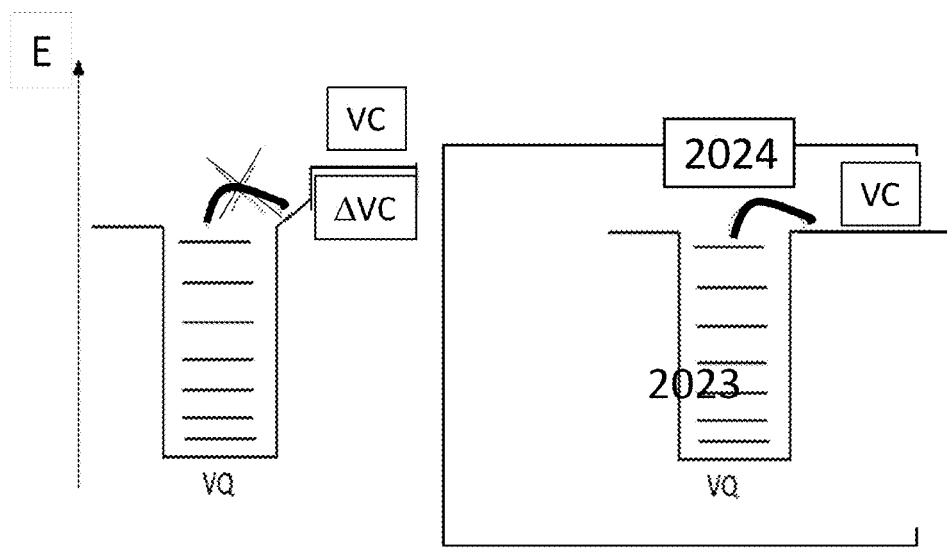

FIGS. 6A-B show then a schematic illustration of the quantization of the electronic levels induced by the voltage or potential (V111, VQ) applied to the first gate stack 111. If ΔVG (being the difference between the voltage applied to the first gate and the voltage applied to the source contact) >0, the electrons on the quantized electronic levels 2023 cannot jump out of the highest energy level of the conduction band due to the depleted density of states (region 2024) (FIG. 6A), the device is hence off. Once ΔVG is small enough to drive the difference in energy for the electron injection close to 0 (or to the energy at room temperature), the electrons are allowed to flow through the conduction band and the device turns on (FIG. 6B). This results in a steep sub-threshold switch.

So, due to the presence of a discrete energy spectrum at the source/injection side of the device, a forbidden band gap localized below the first gate stack (V111) is created in the conduction band and the Fermi level (due to the depleted density of states). As a result, no electrons with energies in this energy gap can be transmitted or thermally excited over a second barrier controlled by the second gate stack (V112, VG). Given that this energy gap is substantial, i.e. order of magnitude several kT=25 meV at room temperature, this device realizes the required energy filtering conditions to obtain a steep subthreshold device. This is due to the cut-off of the high-energy tail in the Fermi-Dirac distribution for those carriers that are relevant, i.e. those carriers having still a statistical significance of being occupied according to the quantum statistics. Those carriers having an energy higher than the forbidden band gap (induced by the depleted density of states in the conduction band) when the gap is larger than at least kT, are thus negligible in determining the subthreshold slope. The potential applied to the second gate stack (V112) controls the amplitude of the modulation of the density of states going from a continuum (V112<1 V) to a depleted density of states whose energy $E_n$ depend on the width of the quantization gate, i.e. the width of the first gate stack. The wave function of conduction is then forced to evolve from a delocalized state to a discrete localized one. Given the discreteness of the level, they cannot accommodate the Fermi-Dirac or Boltzmann distribution (for higher energies above the Fermi level) of the electrons, characteristic of the 60 mv/dec, and accept electron with a very narrow energy window. Whenever the potential of the second gate (V112) is lowered enough, only the electrons with a proper energy profile are allowed to be injected in the conduction band and the device adopts a steep subthreshold slope.

Figure 7:
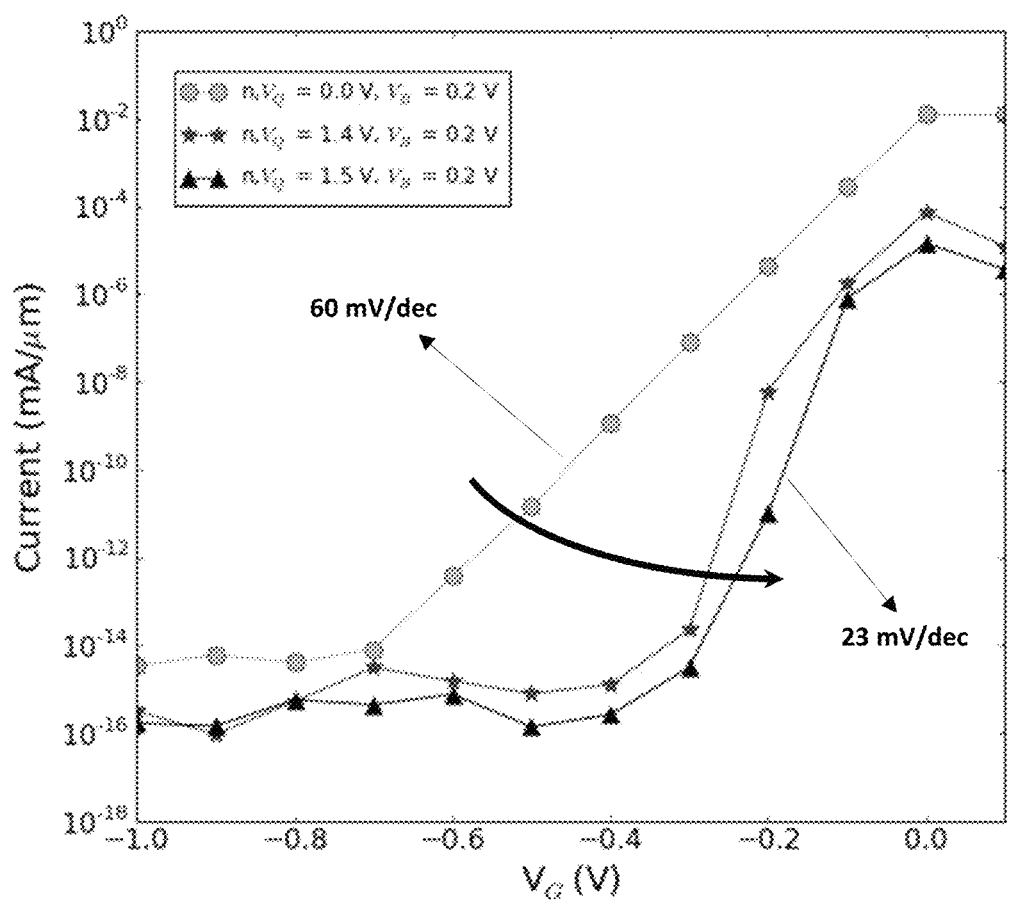
FIGS. 7-10 show simulated I-V curves for a semiconductor device according to different embodiments.

FIG. 7 shows corresponding current-voltage (C-V or also often referred to as I-V) curves for a semiconductor device 1 according to certain embodiments. The current I is thus plotted in function of the voltage (V112, VG) applied to the second gate stack 112. Different C-V curves are shown which correspond to different voltages (V111, VQ) applied to the first gate stack 111 which is varied from 0V to 1.5V at a Vds=0.2V. It can be seen that the steepness of the slope increases with increasing V111. A subthreshold swing of 25 mV/dec can be achieved for a V111 of 1.5V, which is much better than the classical MOSFET limit of 60 mV/dec. The voltage applied to the first gate stack 111 should not be too high (preferably lower than 4V) in order to prevent breakdown of the channel.

The gate lengths of the first 111 and second 112 gate stack and the spacing D between the gate lengths which is preferably between 5 and 30 nm, more preferably between 5 and 15 nm. The subthreshold swing is rather independent to the gate dimensions and the respective spacing in between. However if the gate length becomes too large, i.e. larger than 30 nm, the energy spectrum will evolve to a quasi-continuous spectrum and the steep subthreshold behavior will gradually disappear. If the gate length becomes too small, i.e. smaller than 5 nm, for example 2 nm, loss of control on the drive current is observed. It is an advantage of certain embodiments that relaxed dimensions may be used for the gate lengths of the first and/or second gate stack and corresponding spacing between the first and second gate stack.

Figure 8:
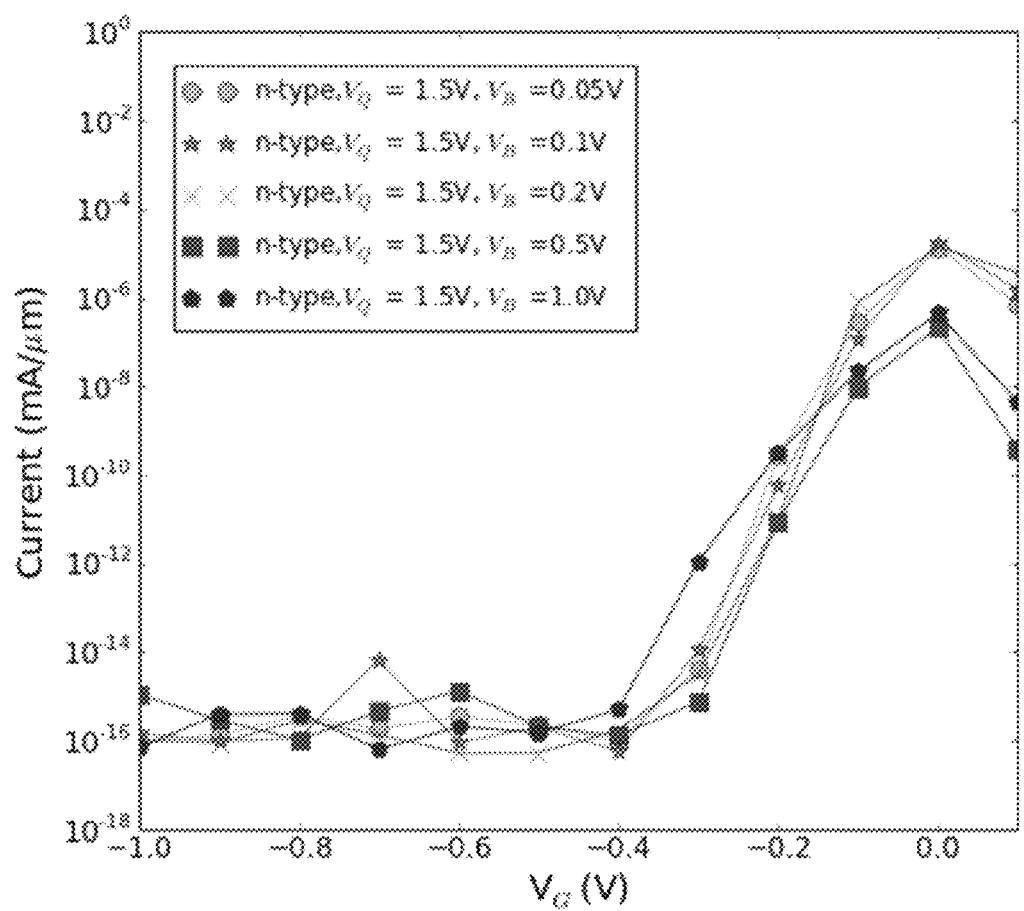

The source-to-drain bias (VDS) is 0.2 V for all results described herewith however also larger voltages may be applied as long as the conduction band and valence band across the device do not overlap which could result in band-to-band-tunneling (and would lead to another kind of device being a tunnel FET—TFET device). FIG. 8 shows corresponding C-V curves for a semiconductor device 1 according to certain embodiments. The current I is thus plotted in function of the voltage (V112, VG) applied to the second gate stack 112. Different C-V curves are shown which correspond to different source-to-drain voltages ranging from 0.05V to 1V. According to embodiments best control and performance of the semiconductor device 1 are achieved at low VDS, i.e. a source-to-drain voltage lower than 1V, more preferably lower than 0.5V.

Figure 9:
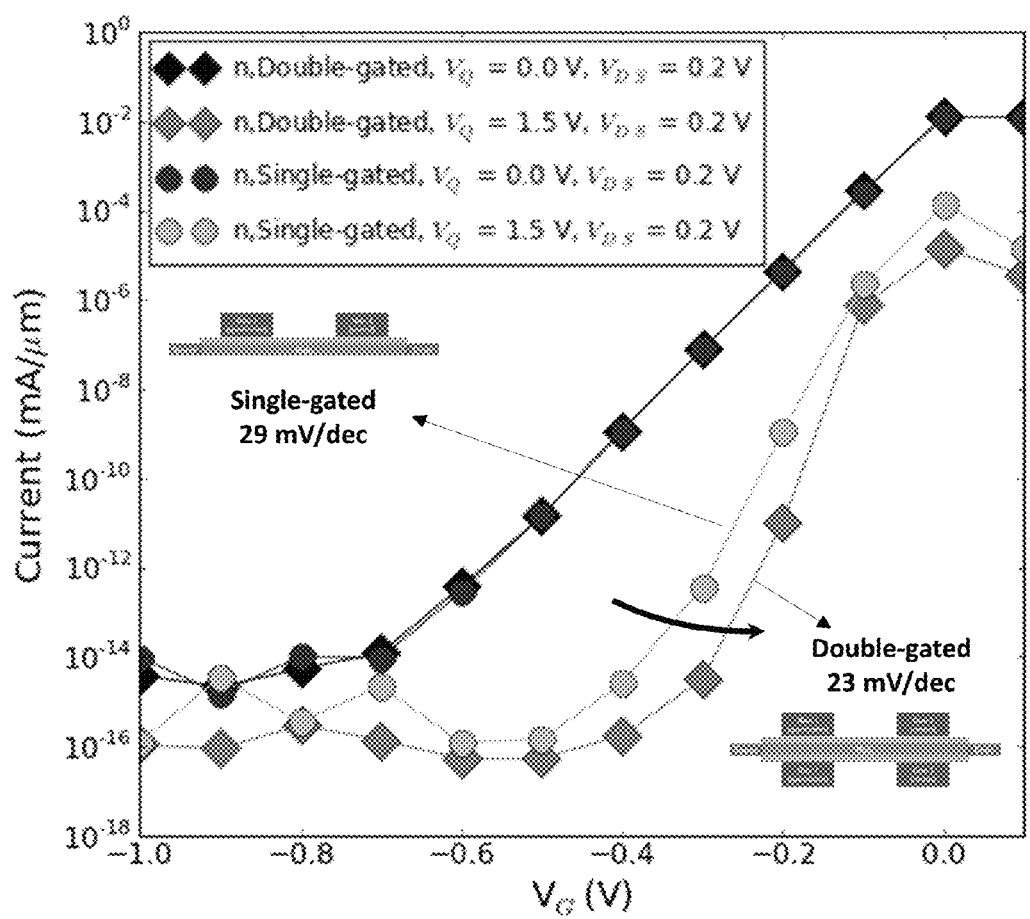

FIG. 9 shows corresponding C-V curves for a semiconductor device 1 according to certain embodiments for both single gated (i.e. the first and second gate stack present at only one side of the 2D material layer) and double gated (i.e. the first and second gate stack present at both sides of the 2D material layer) devices. It can be seen that by using single-gated semiconductor device SS is slightly increased compared to double gated. Double gated semiconductor device 1 are preferred from device characteristics point of view however manufacturing of such double gate semiconductor device 1 may be more challenging.

Figure 10:
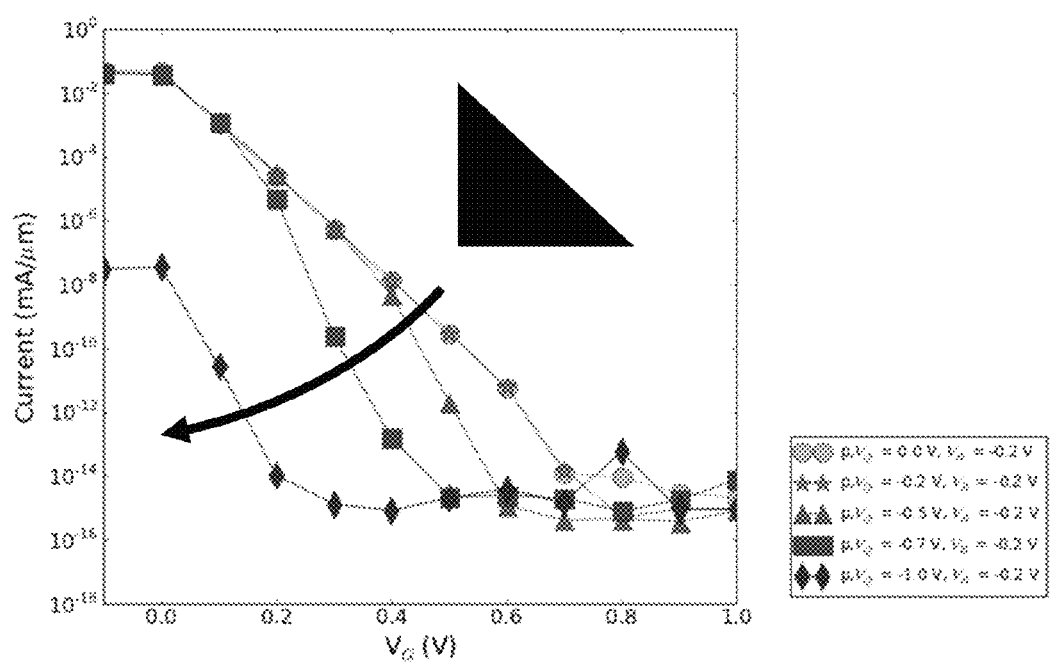

FIG. 10 shows corresponding C-V curves for a semiconductor device 1 according to certain embodiments wherein the semiconductor device comprises a p-type 2D material layer. Also for p-type semiconductor device 1 according to certain embodiments a performance improvement is observed.

Summarizing, the filtering of carriers, nature and intensity of the doping in the 2D material layer is controlled by the amplitude of the voltage applied to the first gate stack 111 and the switching of the device from on to off or vice versa is controlled by the second gate stack 112. Due to the uniform doping of the 2D material layer 100, the semiconductor device 1 is in the on state at no bias (applied to the second gate stack 112). In case of a n-type semiconductor device 1, a positive bias applied to the second gate stack 112 will lead to accumulation of more negative charges below the second gate stack 112, leading to a n++ accumulation region. Inversely, a negative bias applied to the second gate stack 112 will repulse the charge carriers and lead to a n+ depleted region, intrinsic or p− depleted region depending on the amplitude of the applied voltage.

All simulation results disclosed in the description are based on tight-binding simulations combined with a Green's function formalism (with a non-dissipative ballistic) transport formalism for a semiconductor device 1 according to certain embodiments comprising the following characteristics:

a n-type $MoS_2$ channel region with a doping of $10^{12}$ e/cm2;

a gate dielectric with EOT=2 nm;

source-drain voltage VDS being varied from 0.2V to 1V;

gate length of the first gate stack being varied from 5 nm to 30 nm;

gate length of the second gate stack being varied from 5 nm to 30 nm;

a distance D (gate spacing) between the first gate stack and the second gate stack being varied from 2 nm to 30 nm;

work function of the first and second gate stack are chosen to be equal o the electron affinity of $MoS_2$.

V111, the voltage applied to the first gate stack 111, being: 0, 1.1, 1,4 or 1.5V V112, the voltage applied to the second gate stack 112, being varied from 0 to −1V.

Work function: 4.2 eV

Compared to other prior art devices such as tunnel FET devices which also can reach subthreshold swing lower than 60 mV/dec, the semiconductor device according to certain embodiments may achieve sub 60 mV/dec subthreshold swing at low power operation and is moreover applicable for both p-type semiconductor device as n-type semiconductor device (whereas p-type TFETs are very difficult to demonstrate).

The device 1 according to certain embodiments has the advantage that the device relies on 2D materials whose interactions are driven by van-der-Waals weak forces and that by definition there is no interfacial bonds. The device 1 according to certain embodiments has thus the advantage to solve the issues bound to the quality of the interface (due to the formation of defects).

The device 1 according to certain embodiments is easy manufactural as relaxed dimensions may be used. Both horizontal as vertical device may be produced.

While some embodiments described herein include examples of a planar semiconductor device, also other implementations of semiconductor device devices may be applied in embodiments of the present disclosure, such as double-gate semiconductor device, a tri-gate semiconductor device, an all-round gate semiconductor device, or the like. A double-gate semiconductor device comprises a source-channel-drain structure in the plane of a semiconductor substrate, e.g. a horizontal source-channel-drain structure, and a double gate electrode situated on the sidewalls of the source region of the horizontal source-channel-drain structure. A tri-gate semiconductor device comprises a 2D material layer in the plane of a semiconductor substrate, e.g. a horizontal 2D material layer, and a triple gate electrode comprising three gate electrode parts situated respectively on the sidewalls and on top of the source region of the horizontal 2D material layer. A gate all-around semiconductor device comprises a horizontal or a vertical 2D material layer structure, i.e. in the plane of a substrate or substantially perpendicular to the plane of the substrate, and an all-around gate electrode situated around, i.e. surrounding or encircling, the source region of the horizontal or vertical 2D material layer structure.

What is claimed is:

1. A semiconductor device, comprising:
   a two-dimensional material layer having a longitudinal direction, the two-dimensional material layer comprising a channel region, and at opposite sides of the channel region, a source region at one side in a longitudinal direction of the two-dimensional material layer and a drain region at an other side in the longitudinal direction of the two-dimensional material layer;
   a first gate stack and a second gate stack in contact with the two-dimensional material layer, the first and second gate stack being spaced apart over a distance; wherein the first gate stack and the second gate stack each comprise a gate dielectric layer and a gate electrode, the gate dielectric layer being sandwiched between the gate electrode and the two-dimensional material layer, wherein the first gate stack is located on the channel region of the two-dimensional material layer and in between the source region and the second gate stack, wherein the first gate stack is configured to control injection of carriers from the source region to the channel region, wherein the second gate stack is located on the channel region of the two-dimensional material layer, and wherein the second gate stack is configured to control conduction of the channel region.

2. The semiconductor device of claim 1, wherein the first gate stack configured to control the injection of carriers forms discrete energy levels and a region of depleted density of states either in a conduction band or in a valence band of the two-dimensional material layer underneath the first gate stack upon application of a first voltage to the first gate stack at a source-to-drain voltage and a second voltage to the second gate stack.

3. The semiconductor device of claim 2, configured such that upon applying a predetermined first voltage and a variable second voltage, the device may be turned from an OFF state to an ON state.

4. The semiconductor device of claim 3, wherein the semiconductor device is a n-type device configured such that when the first voltage is from 0 to 1.5V and when the second voltage is varied from a negative value to 0V, the device is OFF at the negative value and is turned ON at 0V.

5. The semiconductor device of claim 1, wherein a gate length of the first gate stack and/or the second gate stack is from 2 nm to 30 nm.

6. The semiconductor device of claim 1, wherein the distance is from 2 nm to 30 nm.

7. The semiconductor device of claim 1, wherein the two-dimensional material layer comprises a group IV two-dimensional material or a group III-V two-dimensional material.

8. The semiconductor device of claim 1, wherein the two-dimensional material layer comprises a group V two-dimensional material.

9. The semiconductor device of claim 1, wherein the two-dimensional material layer comprises a transition metal dichalcogenide.

10. A method for operating a semiconductor device, comprising:
    providing the semiconductor device of claim 1;
    applying the first gate voltage to the first gate stack for inducing the discrete energy levels and the depleted density of states in the conduction band or in the valence band in the two-dimensional material layer underneath the first gate stack;
    modulating the second gate voltage of the second gate stack for turning the device from OFF to ON; and
    applying the source-to-drain voltage.

11. The method of claim 10, wherein the first gate voltage is from 0V to 1.5V.

12. The method of claim 10, wherein the first gate voltage is at least 1V.

13. The method of claim 10, wherein the second gate voltage is changed from −1V to 0V, whereby the device is turned from OFF to ON.

* * * * *